United States Patent [19]

Yoshioka et al.

[11] Patent Number: 4,882,238

[45] Date of Patent: Nov. 21, 1989

[54] DIE FOR USE IN FORMING LENS

[75] Inventors: Takashi Yoshioka; Akira Doi, both of Itami, Japan

[73] Assignee: Sumitomo Electric Industries, Ltd., Osaka, Japan

[21] Appl. No.: 251,945

[22] Filed: Oct. 3, 1988

Related U.S. Application Data

[63] Continuation of Ser. No. 70,122, Jan. 6, 1987, abandoned, which is a continuation of Ser. No. 821,913, Jun. 23, 1986, abandoned.

[30] Foreign Application Priority Data

Jan. 28, 1985 [JP] Japan .................................. 60-14066

[51] Int. Cl.$^4$ .............................................. B32B 9/00
[52] U.S. Cl. ..................................... 428/698; 428/699
[58] Field of Search ............... 428/698, 699, 469, 446; 427/47

[56] References Cited

U.S. PATENT DOCUMENTS

| | | | |
|---|---|---|---|
| 4,474,849 | 10/1984 | Fujimori et al. | 428/698 X |
| 4,522,844 | 6/1985 | Khanna et al. | 427/47 X |
| 4,585,704 | 4/1986 | Hirai et al. | 428/698 X |
| 4,594,294 | 6/1986 | Eichen et al. | 428/698 X |
| 4,608,326 | 8/1986 | Neukermans et al. | 428/698 X |

*Primary Examiner*—Nancy A. B. Swisher
*Attorney, Agent, or Firm*—Wenderoth, Lind & Ponack

[57] ABSTRACT

The present invention relates to a die for use in forming optical lenses made of glass or synthetic resin used in OA instruments, VTR, cameras and the like. In order to lengthen the useful life of the die by suppressing the oxidation or deterioration of the die surface due to temperature and atmosphere and reaction of materials of which lenses are made, when lenses are formed, the die is coated with a single-layer or multi-layer thin film of $Si_3N_4$ or SiC or compounds thereof, which are superior in wear and corrosion resistance at high temperatures, by the vapor coating method.

1 Claim, No Drawings

DIE FOR USE IN FORMING LENS

This application is a continuation of now abandoned application Ser. No. 070,122, filed July 6, 1987, now abandoned, which is a continuation of now abandoned application Ser. No. 821,913 filed Jan. 23, 1986, now abandoned.

BACKGROUND OF THE INVENTION 1. (Field of Invention)

The present invention relates to a die for use in forming optical lenses made of glass or synthetic resin used in OA (office automation) instruments, VTR (video tape recorder), cameras and the like and aims at the prolongation of a useful life of the die by suppressing the oxidation or deterioration of the die surface due to temperature and atmosphere and reaction or wear caused by friction of materials, of which lenses are made, when lenses are formed.

2. (Prior Art)

Optical lenses have been formed by the lapping method using an inefficient pitching device. That is to say, lenses have been formed one by one, in particular nonspherical lenses have been finished by skilled manual operation with repeated workings and measurements.

On the contrary, a forming method using a metal die has been increasingly utilized as a mass production method in place of the conventional grinding method and polishing method since (1) it is higher in productivity; and (2) the products show less nonuniformity in quality in comparison with the conventional methods.

However, since the shape and accuracy of the surface of optical lenses used in OA instruments, VTR, cameras and the like are measured with wave length of lights as a standard, the working of optical lenses requires a remarkably high accuracy.

Accordingly, in the event that optical lenses are produced by the forming method, the roughness of the surface of the metal die requires high accuracy in addition to a high dimensional accuracy for cavities and cores of the metal die in respect of the transferring property thereof.

The above described forming method has a problem in a useful life of metallic materials.

Although the operation condition of a metal die is dependent upon materials of lenses to be formed, a metal die is usually used in an oxidizing atmosphere at high temperatures, so the accuracy of the surface of a remarkably expensive metal die is reduced within a comparatively short period of time owing to the oxidation and deterioration of the surface of the metal die, chemical reactions between glass and the metal die and the like, thereby losing its usefulness.

On account of the above described, the price of optical lenses has not been reduced.

SUMMARY OF THE INVENTION

It is an object of the present invention to solve the above described problems and provide a lens-forming die having superior wear and corrosion resistance.

The inventors have discovered that this object can be accomplished by a lens-forming die provided with a single-layer or multi-layer thin film made of $Si_3N_4$ or SiC or compounds thereof, which are superior in corrosion resistance at high temperatures, formed on a surface thereof.

DETAILED DESCRIPTION OF THE INVENTION

Since, according to the present invention, a die for use in forming lenses is coated with a thin film made of $Si_3N_4$ or SiC or compounds thereby which are superior in corrosion resistance at high temperatures, no oxidation, deterioration and the like of the die substrate are developed and a roughened surface and the like of the substrate are not easily developed.

In addition, although the thin film may have either a crystalline structure, or an amorphous structure, the latter is preferable in respect of surface roughness, easy polishing and the like of the thin film.

That is to say, although a die for use in forming lenses requires a surface roughness ($R_{max}$) of 300 to 500 Å or less with wave lengths of light as a standard, a thin film formed by the usual vapour coating methods (for example, CVD and PVD) has large crystal grain sizes which do not meet the above described condition at all.

Although a crystalline thin film coated by vaporization can be polished, it is remarkably difficult to polish due to its high hardness and has a defect in that expensive working is required.

On the other hand, an amorphous thin film is easy to control crystal grain sizes and can have a surface roughness $R_{max}$ of 1,000 Å or less.

In general, the plasma vapour coating method is being investigated as a method of forming an amorphous thin film. The reason for this is that the chemical reaction of gaseous materials required for the formation of a thin film is not only "thermally" caused but also promoted by activating the gaseous materials by the use of "plasma" and the like, and thereby the thin film can be effectively formed and the characteristics of the film can be improved.

The present inventors found from the results of various experiments that it was most effective to use CVD for the uniform vapour coating of a substrate having a spherical surface or non-spherical surface such as a die for use in forming lenses, from the point of view of the distribution of film thickness and the circulation of gaseous materials.

Thus, the present inventors further investigated a method of efficiently coating an amorphous film having $R_{max}$ of 1,000 Å or less by vaporization and concluded that the "plasma-CVD", in which "plasma" is combined with "CVD", was most suitable.

Also, after further investigations, the present inventors found that DC, RF, microwave and the like were remarkably effective as a plasma power source.

(PREFERRED EMBODIMENTS)

The present invention is below described in more detail with reference to the preferred embodiments.

EXAMPLE 1

A metal die made of carbide alloys was coated with a crystalline and amorphous film of SiC and $Si_3N_4$ of 3 μm thick by the usual CVD and plasma-CVD using a RF power source of 13.56 MHz.

Since the surface roughness of samples obtained by plasma-CVD was about 800 Å, also samples obtained by CVD and samples not subjected to a surface treatment were finished to a degree of about 800 Å by polishing.

A number of these samples were used in the formation of lenses made of PMMA (polymethylmethacrylate) to evaluate the performance thereof. The results are shown in Table 1.

TABLE 1

| Substance to be coated | Vapour coating method | Structure | Number of times of using until a useful life expires* |
|---|---|---|---|
| SiC | CVD | Crystalline | 5900 |
| " | Plasma-CVD | Amorphous | 6800 |
| $Si_3N_4$ | CVD | Crystalline | 6100 |
| " | Plasma-CVD | Amorphous | 5300 |
| Comparative Example Non coated | — | — | 1800 |

Note
*A useful life was judged by $R_{max} \leq 1,200$ Å.

EXAMPLE 2

A die made of stainless steel was coated with an amorphous film of SiC of 3 μm thick by plasma-CVD using a high-frequency power source of 13.56 MHz at a vapour coating temperature of 500° C.

Both a die coated with a SiC film and a metal die made of stainless steel not subjected to the coating treatment showed surface roughness of 1,000 Å or less. These dies were used in the formation of plastic lenses made of acrylic resin with the results that the metal die made of stainless steel not coated with a SiC film showed surface roughness of 1,300 Å after using 7,500 times but that coated with the SiC film showed surface roughness of 1,000 Å or less even after using 10,000 times.

EXAMPLE 3

A die made of carbide alloys was coated with an amorphous film of $Si_3N_4$ of 5 μm thick by plasma-CVD using DC-plasma at 800° C. Both a die coated with a film of $Si_3N_4$ and that not coated with the film were tested on for oxidation resistance for 10 min. at 950° C. Both dies showed surface roughness of 800 Å before the test. It was found that the die not coated with the film $Si_3N_4$ produced "fogging" on the surface thereof after heat-treating 1,200 times and lost its usefulness at a surface roughness R of 1,300 Å, while the die coated with the film of $Si_3N_4$ did not produce "fogging" on the surface thereof and maintained the surface roughness of 800 Å or less even after heat-treating 2,000 times.

EXAMPLE 4

A metal die made of Ni-base super alloys was coated with an amorphous film of Si(CN) of 0.7 μm thick by plasma-CVD using a microwave power source of 2.45 GHz. The metal die coated with the film of Si(CN) and that not coated with the film were used in the formation of PMMA to compare their characteristics. It was found that the die not coated with the film of Si(CN) produced "fogging" after using 1,500 times and lost its usefulness at a surface roughness of 1,350 Å, while the metal die coated with the film of Si(CN) had a glossy surface and maintaining a surface roughness of 1,000 Å or less even after using 2,000 times.

(EFFECTS OF THE INVENTION)

As described above, the corrosion resistance and useful life of a die can be remarkably improved by coating it with $Si_3N_4$ or SiC or compounds thereof by vaporization.

We claim:

1. A die having superior wear and corrosion resistance, a surface roughness $R_{max}$ of 1000 Å or less, and which is a structure for forming optical lenses, wherein said die is coated at a temperature of 800° C. or lower with a single or multi-layer amorphous film of silicon nitride, silicon carbide or a combination thereof, having a thickness of 5 μm or less, by a plasma-CVD coating method.

* * * * *